United States Patent [19]
Tighe et al.

[11] Patent Number: 6,146,912
[45] Date of Patent: Nov. 14, 2000

[54] METHOD FOR PARALLEL ALIGNMENT OF A CHIP TO SUBSTRATE

[75] Inventors: Thomas S. Tighe, Pasadena; Gershon Akerling, Culver City, both of Calif.

[73] Assignee: TRW Inc., Redondo Beach, Calif.

[21] Appl. No.: 09/309,945

[22] Filed: May 11, 1999

[51] Int. Cl.[7] .......................... H01L 21/66; G01R 31/26
[52] U.S. Cl. ................................. 438/15; 438/800
[58] Field of Search .......................... 438/15, 14; 29/834;
228/4.1, 4.5, 5.1, 5.5, 5.7, 6.1, 6.2, 44.7,
49.1; 414/795.7

[56] References Cited

U.S. PATENT DOCUMENTS

| | | |
|---|---|---|
| 3,840,978 | 10/1974 | Lynch et al. ............................. 29/493 |
| 5,118,584 | 6/1992 | Evans et al. . | 
| 5,558,271 | 9/1996 | Rostoker et al. . |

OTHER PUBLICATIONS

Brochure: Research Devices, Inc., Flip Chip Aligner Bonders, 4 pages.

*Primary Examiner*—Charles Bowers
*Assistant Examiner*—Craig Thompson
*Attorney, Agent, or Firm*—Michael S. Yatsko

[57] ABSTRACT

A method and apparatus for bonding a chip to a substrate is described, wherein the apparatus includes a chip holder assembly comprising an outer holder having a cavity formed therein and an inner holder for holding the chip, and by releaseably securing the inner holder within the outer holder cavity and contacting the chip to the substrate the inner holder has selective angular rotation within the cavity to make parallel the chip and the substrate.

3 Claims, 7 Drawing Sheets

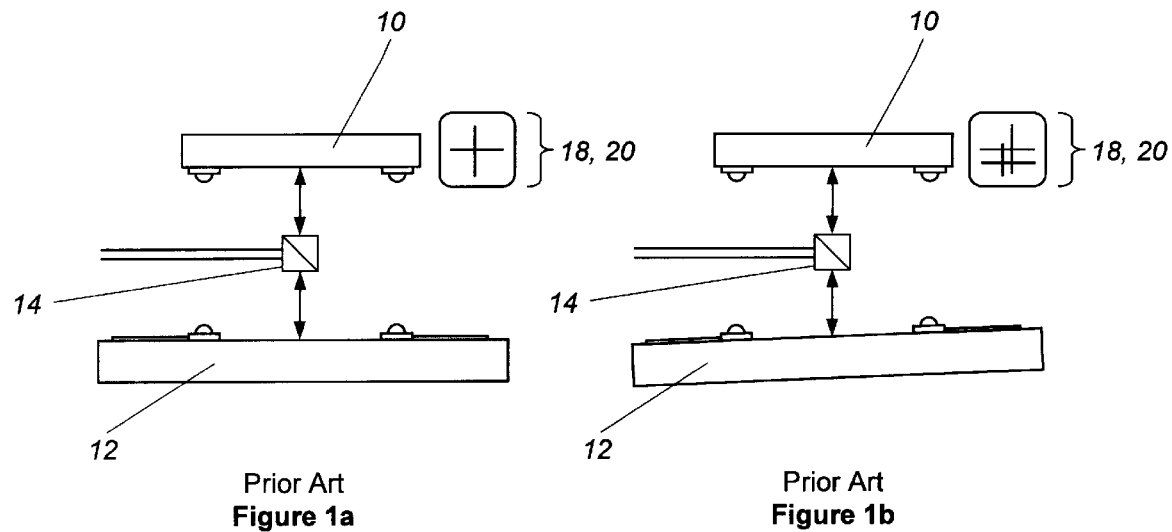
Prior Art
Figure 1a
Prior Art
Figure 1b
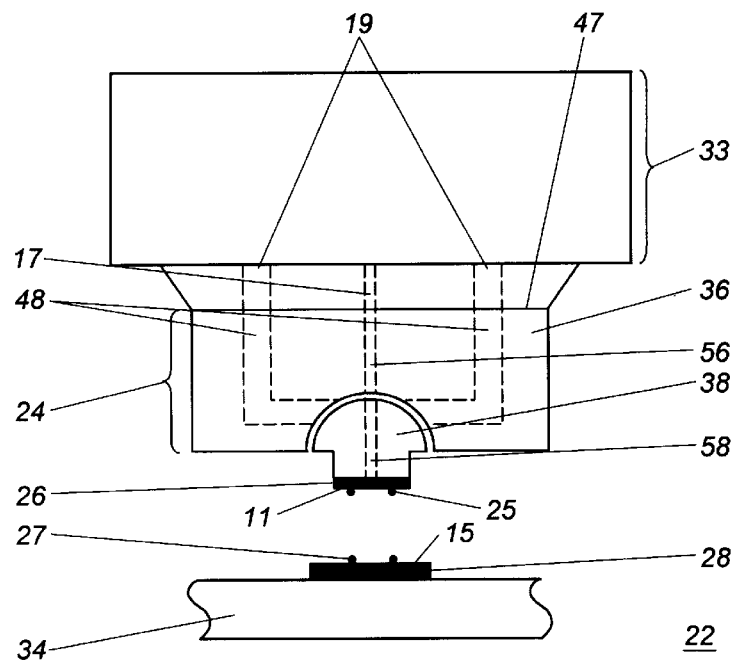
Figure 2

METHOD FOR PARALLEL ALIGNMENT OF A CHIP TO SUBSTRATE

The U.S. Government has certain rights in this invention pursuant to the clause at FAR 52.227–12.

BACKGROUND OF THE INVENTION

1. Field of the Invention

The present invention relates generally to device interconnection techniques, and more specifically to an apparatus for attachment of semiconductor or superconducting chips directly to circuit boards or multi-chip modules.

2. Description of the Prior Art

Conventional techniques for interconnecting semiconductor chips to substrates include ball-grid array (BGA), micro-ball grid array (μBGA) and "flip-chip" bonding. These techniques traditionally use a conductive pattern formed on a surface of a semiconductor chip that is mounted and mated to a corresponding conductive pattern formed on a surface of a substrate. Typically, the conductive patterns include bump-like mating pads formed of solder, gold or epoxy. To perform the chip-to-substrate attachment a bonder instrument may be used. Conventional bonders use various techniques to achieve parallel alignment between the chip and the substrate. Parallel alignment is required to ensure that the bump-like mating pads formed on the chip, mate with corresponding pads formed on the substrate where each chip bump makes full surface area contact with equal amounts of pressure to each corresponding substrate bump. The result of improper parallel alignment between the chip and the substrate is unconnected mating pads and hence open circuits.

Present bonders may employ either of two techniques for making a chip parallel with a substrate or board. A first technique involves using cameras and targets. A chip and a substrate 12 are separated by approximately a one-half inch gap and an assembly of prisms and camera lenses 14 is inserted into the gap. Through the assembly 14, an indicia, such as a cross, is projected onto the chip 10 and the substrate 12 respectively. The cross is reflected back from the surfaces of the chip 10 and substrate 12 onto a camera lens 14. As illustrated in FIG. 1a, the bonder system is calibrated so that if the chip 10 is parallel with the substrate 12, the cross image 18 reflected back from the chip surface will overlie with the cross image 20 reflected back from the substrate surface. Conversely, as illustrated in FIG. 1b, if the chip 10 is not parallel with the substrate 12, the reflected cross images (18, 20) will not overlie, and a series of mechanical or hydraulic controls may be used to bring the two crosses to the point where they align. Following the parallel alignment of the chip and the substrate, the prism and lens assembly 14 is retracted and the chip 10 is brought down to the substrate 12 for attachment.

The system previously described has several disadvantages, including limited angular precision and incompatibility with smaller contact pads, and lack of functionality when used with non-reflective chip or semiconductor surfaces. Specifically, conductive pads used in industry are from approximately 100 μm to 150 μm in height. To increase the data transmission rate through a conductive pad or bump interconnection, the height of the conventional bump must be decreased from the 100 μm to 150 μm range down to as small as 2 μm. Shorter pads require a tighter angular precision to orient the chip parallel with the substrate, and conventional camera and lens bonding systems have limited angular precision. Conventional camera and lens systems also require reflective chip and substrate surfaces so that the cross can be reflected back from the chip and substrate to the camera. Many substrate materials do not reflect light clearly or have multi-faceted surfaces that reflect light in multiple directions with equal or varying intensities. The effect is difficulty or impossibility in choosing the correct crosses to align.

A second technique uses a floating chuck assembly. Without a chip or a substrate in the system, a chuck is brought into contact with a flat plate on which the substrate will be disposed. Pressure is applied until the two flat surfaces are parallel, the chuck is locked into position either using a vacuum or a mechanical means, and the chip and substrate are placed into the assembly. This technique is successful only to the extent that both the substrate and the chip have front to back side parallellity. Additionally, this technique would not be suitable for use with the substrate and chip already in place, since the pressure used to assure the appropriate degree of parallellity, combined with the weight of the chuck assembly, would likely damage fragile chip components. As mentioned previously, this technique may employ locking the chuck into position by using a vacuum. A vacuum nipple and hose are typically connected directly to the floating portion of the chuck and this configuration applies unwanted torque on the floating portion of the chuck, thereby resulting in increased angular precision errors.

Based on the techniques known in the art for bonding chips to printed circuit boards or multi-chip modules, a bonding apparatus that increases the precision of the chip to board attachment while reducing the complexity of overall bonding process is highly desirable.

SUMMARY OF THE INVENTION

It is an aspect of the present invention to provide an apparatus for making parallel a chip and a substrate. Briefly, the apparatus includes a chip holder assembly comprising an outer holder having a cavity formed therein and an inner holder for holding the chip. By releasably securing the inner holder within the outer holder cavity, the inner holder has selective angular rotation within the cavity. In addition, the angular rotation of the inner holder within the cavity may be prevented.

It is also an aspect of the present invention to provide a method for obtaining parallel alignment between a chip and a substrate. The method includes the steps of applying a first vacuum to hold the chip to an inner holder and applying a second vacuum to releaseably hold the inner holder within a cavity formed on an outer holder. The chip is placed in contact with the substrate and the second vacuum is released allowing the inner holder to rotate within the outer holder cavity while the chip aligns parallel with the substrate. The second vacuum is reapplied to secure the parallel orientation of the inner holder.

BRIEF DESCRIPTION OF THE DRAWINGS

Reference is now made to the following specification and attached drawings, wherein:

FIG. 1a is a prior art illustration of a parallel chip and substrate using a chip bonder having an assembly of prisms and cameras;

FIG. 1b is a prior art illustration of a non-parallel chip and substrate using the chip bonder and assembly of prisms and cameras illustrated in FIG. 1a;

FIG. 2 is a front perspective view illustration of a bonding apparatus including a chip holder assembly in accordance with a preferred embodiment of the present invention;

FIG. 7b is a side orthogonal view illustration of the top of the chip holder illustrated in FIG. 7a;

DETAILED DESCRIPTION OF THE INVENTION

Figure 3:
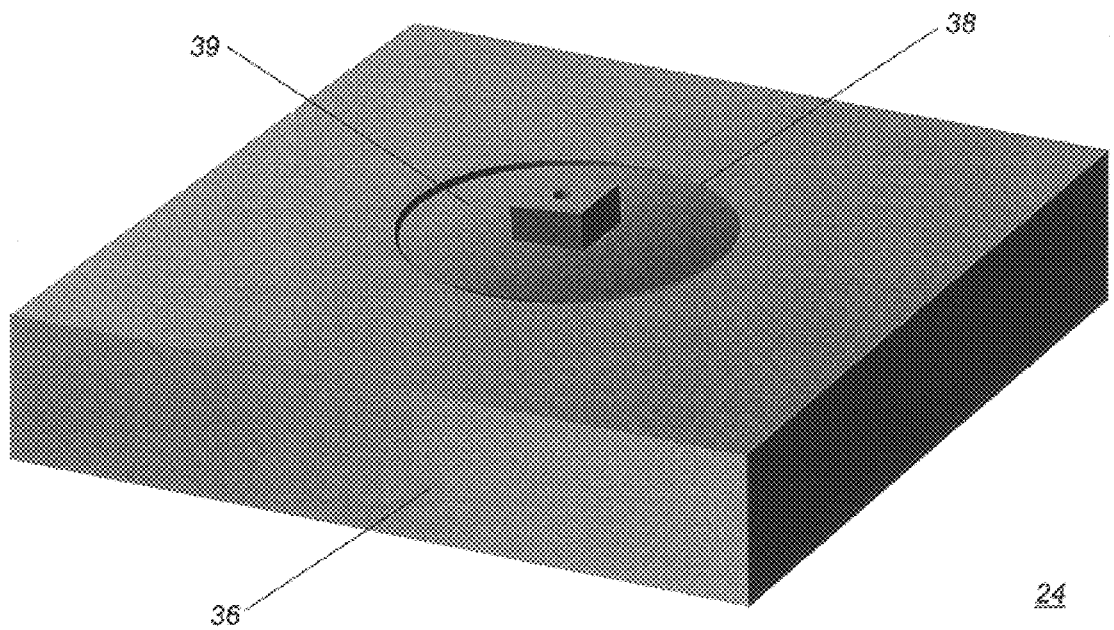
FIG. 3 is an orthogonal view illustration of the bottom of the chip holder assembly.

Referring to FIG. 2, the present invention discloses a bonding apparatus 22 and, more particularly, a chip holder assembly 24 for the attachment of a device chip 26 having a pattern of conductive pads 25 formed on a surface 11 of the chip 26 to a substrate 28 having a corresponding pattern of mating conductive pads 27 formed on a surface 15 of the substrate 28. The chip holder assembly 24 of the present invention is utilized to increase the degree of parallellity between the chip 26 and the substrate 28 and includes an outer holder 36 and an inner holder 38. The chip 26 is held in the chip holder assembly 24. The chip holder assembly 24 is fastened to a chuck 33, where the chuck 33 includes a central channel 17, a plurality of outer channels 19 and a means for supplying vacuums within the channels 17, 19 to the chip holder assembly 24. The substrate 28 is disposed on a bonding plate 34 spaced from the chip holder assembly 24 and the substrate 28 may be a printed circuit board (PCB) or multi-chip module (MCM).

Figure 4:
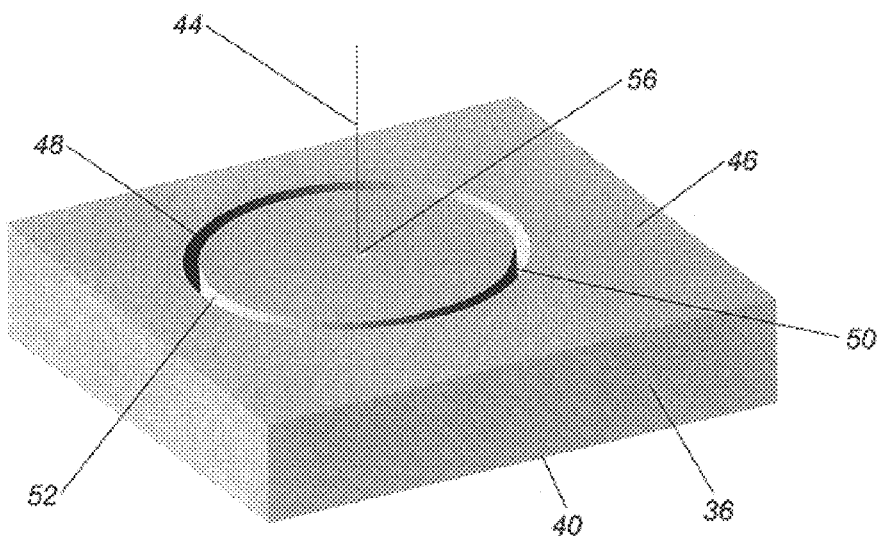
FIG. 4 is an orthogonal view illustration of the top of a holder.
Figure 5:
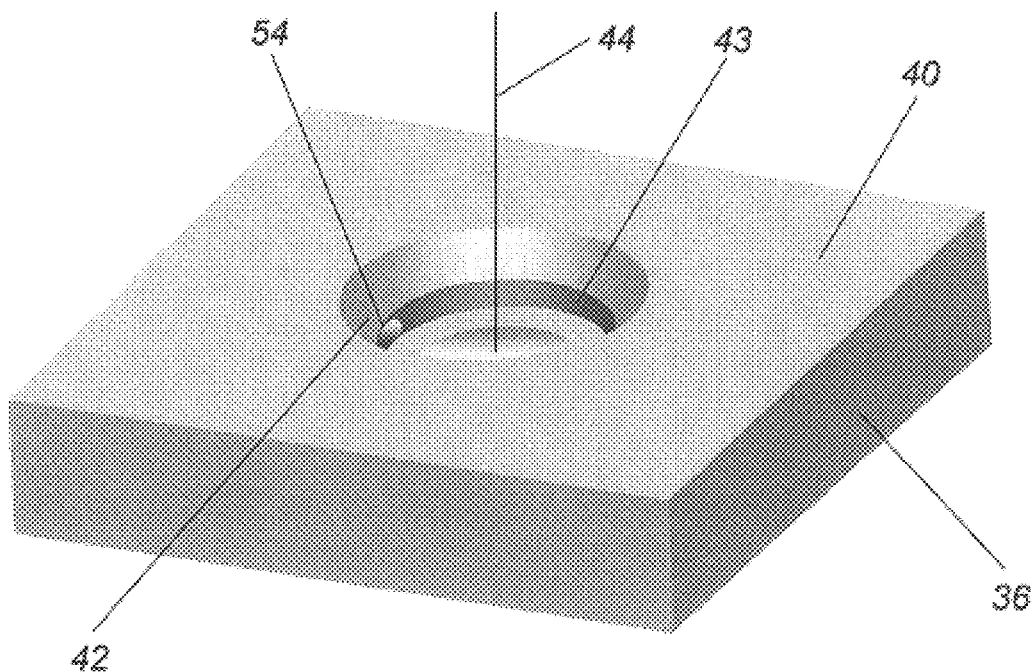
FIG. 5 is an orthogonal view illustration of the bottom of the holder.
Figure 6:
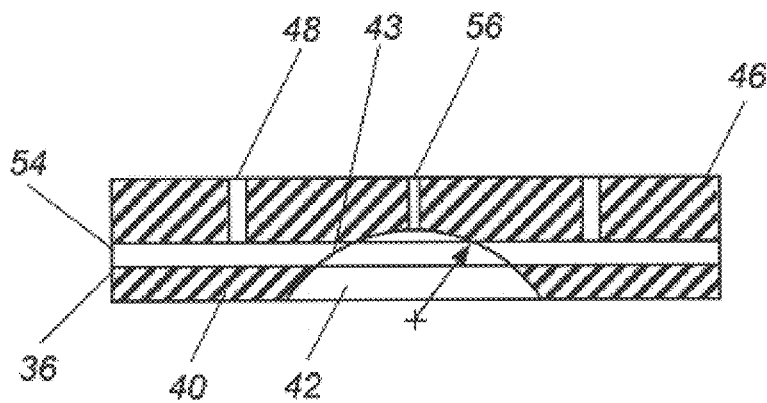
FIG. 6 is a cross-sectional view illustration of the holder illustrated in FIG. 4.

Referring to FIG. 3, the chip holder assembly 24 is constructed from an outer holder 36 and an inner holder 38, with the inner holder 38 preferably being a hemispherically shaped ball 39. The outer holder 36, as shown in FIG. 4, is preferably rectangular or square shaped and formed of stainless steel. A small vacuum opening 56 is formed along a central vertical axis 44 of the outer holder 36. During the fastening of the chip holder assembly 24 to the chuck 33, the small vacuum opening 56 is aligned coincidentally with the corresponding chuck channel 17 (see FIG. 2). A preferred embodiment of the present invention includes a ring-shaped channel 48 formed, on a second surface 46 of the outer holder 36 opposite a first surface 40, and about the central vertical axis 44. The channel 48 has an inner wall 50 concentric with an outer wall 52. As illustrated in FIGS. 5 and 6, the outer holder 36, has a plurality of symmetrically disposed vacuum openings 54 extending from the inner wall 50 to a lip portion 43 of a hemispherical cavity 42 formed in the outer holder surface 40. During the fastening of the chip holder assembly 24 to the chuck 33, a flat surface 47 of the chuck 33 creates a closed ceiling over the ring-shaped channel except where segments of the channel 48 are aligned coincidentally with the plurality of channels 19, as shown in FIG. 2. Referring to FIG. 5, in the first surface 40 of the outer holder 36, the hemispherical cavity 42 including the lip portion 43 is formed about the central vertical axis 44. The radius of the hemispherical cavity 42 is preferably selected to provide a relatively tight fit between the spherical end of the ball 39 and the hemispherical cavity 42 at the lip portion 43, allowing a fit where the ball 39 is able to rotate within the cavity 42.

Figure 7A:
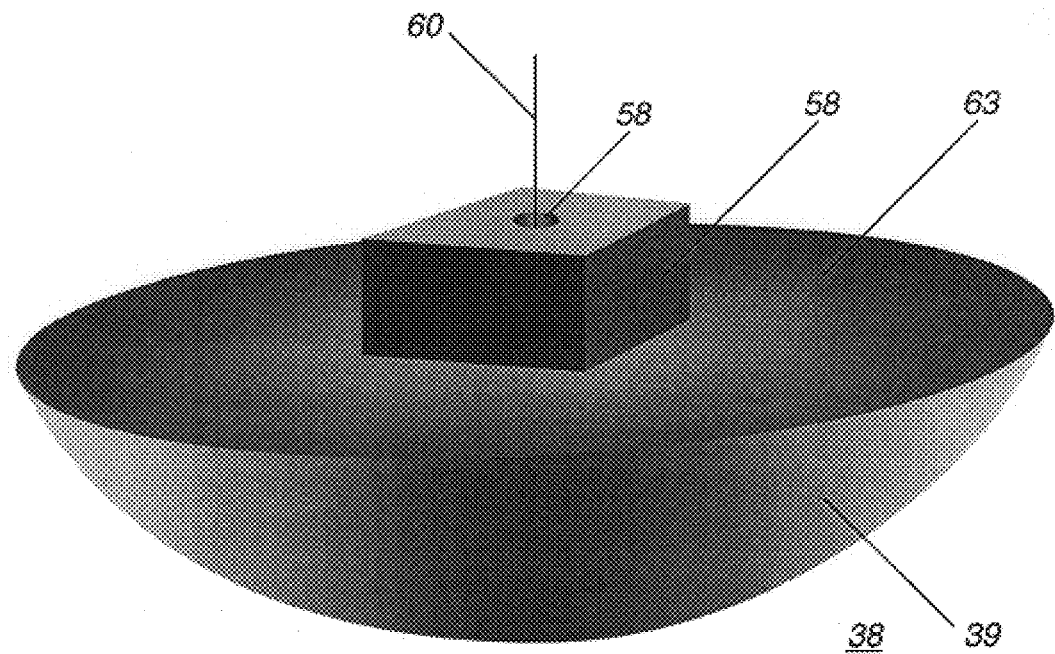
FIG. 7a is a side orthogonal view illustration of the bottom of a chip holder.
Figure 7B:
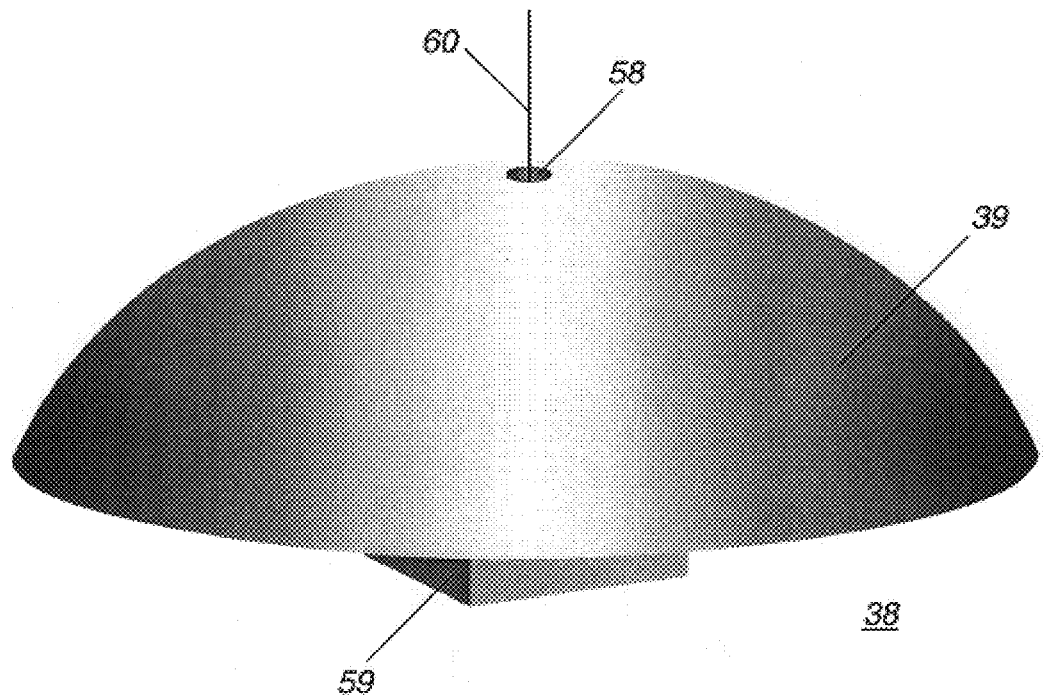

Referring to FIGS. 7a and 7b, the inner holder 38, includes the ball 39, preferably formed of stainless steel. Milled or attached to a flat surface 63 of the ball 39 is a flat platform 59, preferably a stainless steel material, on which the chip 26 will be held. A small vacuum opening 58, extends along a central vertical axis 60 of the inner holder 38 through the flat platform 59.

Figure 8:
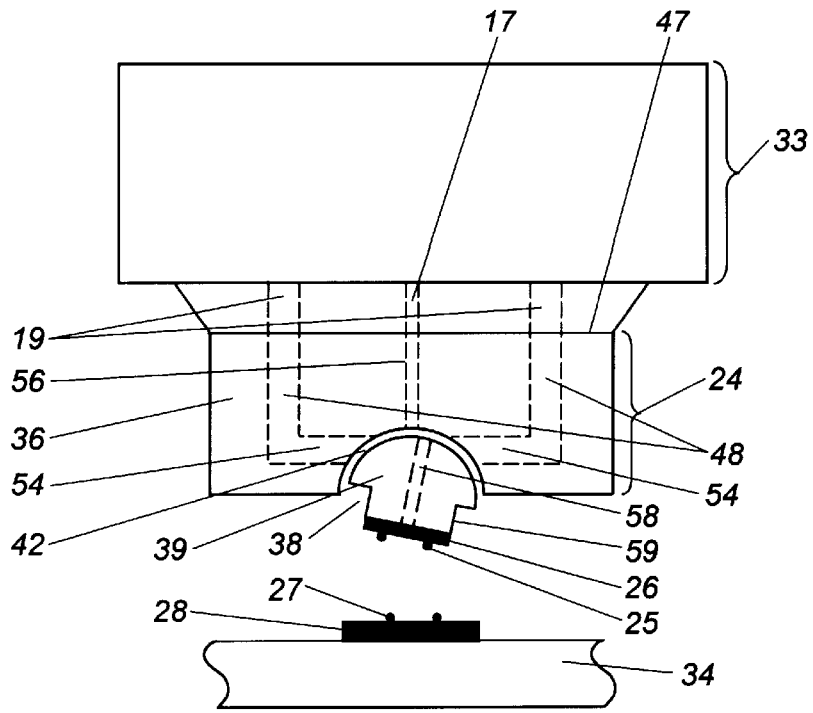
FIG. 8 is a cross-sectional view illustration of the chip holder illustrated in FIGS. 7a and 7b, rotating within a cavity of the holder illustrated in FIGS. 4, 5, and 6.

Referring to FIG. 8, the outer holder 36 and the inner holder 38 are assembled to allow the chip 26 the angular movement that is necessary to achieve tight parallel tolerances, preferably less than 0.01 degrees. Such tolerances are defined by an angle between a non-parallel orientation of the chip 26 to the substrate 28 and a parallel orientation of the chip 26 to the substrate 28. To allow angular placement of the chip 26, the inner holder 38 is disposed in the hemispherical cavity 42 of the outer holder 36, with the holder platform 59 extending outward to face the substrate 28. The inner holder ball 39 is held in place using a vacuum means within the chuck 33 that supplies a vacuum through the chuck channels 19 to the chip holder assembly 24. Specifically, the chuck channels 19 are coincidentally aligned over segments of the outer holder ring-shaped channel 48 and, except in those segments of the channel 48 coincident with the chuck channels 19, the chuck assembly surface 47 creates a ceiling over the ring shaped channel 48. The ball vacuum travels from the channels 19 into the ring channel 48 where it is distributed into the outer holder vacuum openings 54, and into the hemispherical cavity 42. The ball vacuum traveling through the plurality of vacuum openings 54 to the hemispherical cavity 42, provides even pressure against the inner holder ball 39 so that the ball 39 does not rotate within the cavity 42 when locked by applying the ball vacuum. It is important to note that unlike conventional techniques using vacuum holding mechanisms, the present invention does not apply undesired torque on the pivoting inner holder ball 39 by attaching vacuum nipples and hoses directly to the ball 39. Instead, the vacuum configuration disclosed in the present invention eliminates any torque on the pivoting inner holder ball 39 that may adversely effect planar tolerances between the chip 26 and the substrate 28 by supplying the vacuum at the outer holder 36.

Similar to the technique used for holding the ball 39 within the outer holder cavity 42, the chip 26 is held in place on the platform 59 using the vacuum means within the chuck assembly 33 that supplies a second vacuum through the chuck channel 17 to the chip holder assembly 24. The outer holder vacuum opening 56 and the inner holder vacuum opening 58 are aligned with the chuck channel 17. The chip vacuum travels from the channel 17 through the outer holder vacuum opening 56 to the inner holder vacuum opening 58, where the inner holder vacuum opening 58 is beneath the chip 26 disposed on the platform 59. The chip vacuum created at the surface of the chip 26 holds the chip 26 to the platform 59. It is important to keep the vacuum openings 56 and 58 small, since during the chip 26 attachment process, the chip 26 must be held onto the inner holder platform 59 using the chip vacuum, but the ball 39 must be free to simultaneously rotate within the hemispherical cavity 42. If the vacuum openings 56 and 58 were too large, the amount of vacuum traveling from the outer holder vacuum opening 56 to the inner holder vacuum opening 58 would hold the ball 39 stationary within the outer holder cavity 42. In addition, the vacuum opening 56 must be large enough so that at the maximum angle the ball 39 is rotated within the spherical cavity 42, there is some overlap between the inner holder vacuum opening 56 and the outer holder vacuum opening 58.

Figure 9A:
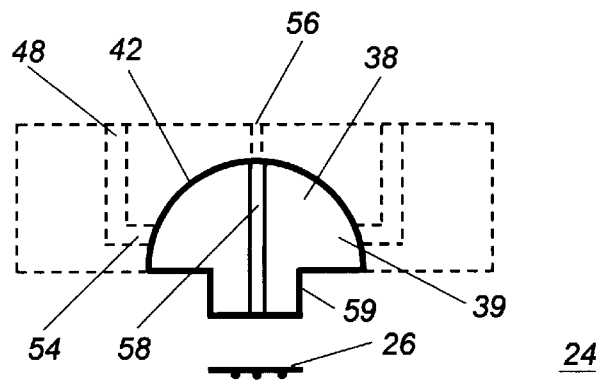
FIGS. 9a through 9h are cross-sectional view illustrations of mating steps between a chip and a substrate.
Figure 9B:
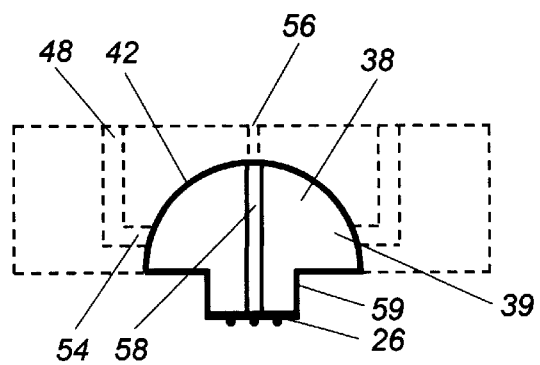

Referring to FIGS. 9a through 9h, a method for bonding the chip 26 to the substrate 28 using the chip holder assembly 24 is illustrated. Specifically, as shown in FIGS. 9a and 9b, a vacuum is applied through the openings 48, 54 to hold the ball 39 in place within and against the hemispherical cavity 42. A second vacuum is applied through the openings 56 and 58 to the back surface of the chip 26 to hold the chip 26 firmly against the platform 59, with the chip surface 11 containing the conductive pads 25 exposed. The second vacuum is enough to hold the chip 26 against the platform 59 and allow rotation of the ball 39 within the cavity 42.

Figure 9C:
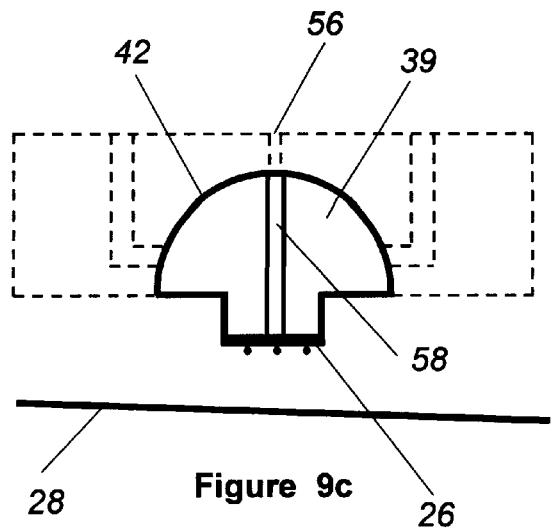
Figure 9D:
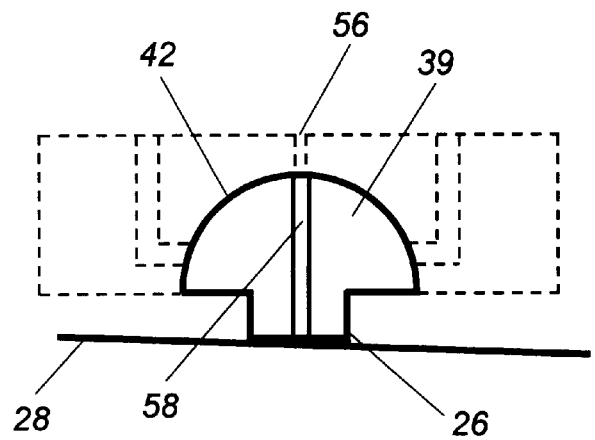
Figure 9E:
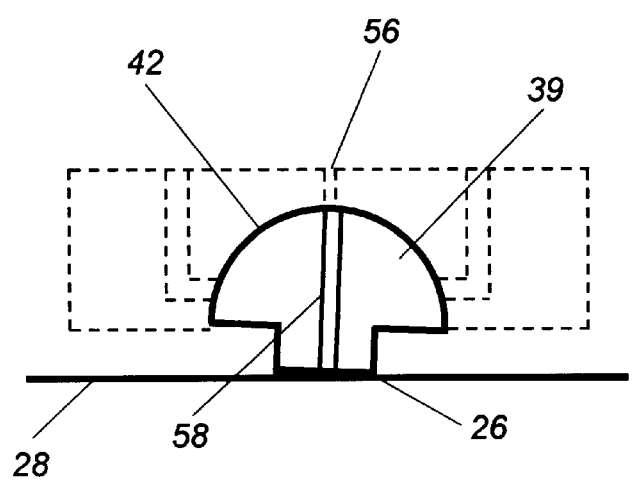

Referring to FIGS. 9c through 9e, with the chip 26 secured in the chip holder assembly 24, the assembly 24 is lowered towards the substrate 28 so that the chip 26 contacts the substrate 28. Preferably, the chip 26 contacts the substrate 28 in an area away from the contact pads 27 so that the chip 26 contacts a completely flat area of the substrate 28 to ensure the highest degree of parallellity. The ball vacuum is momentarily released allowing the first holder ball 39 and the chip 26 to rotate within the cavity 42 until the chip 26 is precisely parallel with the substrate 28. Slight pressure may be applied at the chip 26 to facilitate the parallellization. It is important to note that the present invention is able to adjust parallellity between the typically non-smooth front or back surfaces of chips and substrates. In conventional systems, parallellity between a chip and a substrate is accomplished by adjusting the parallellity between the flat surfaces on which the chip and the substrate are respectively disposed.

Figure 9F:
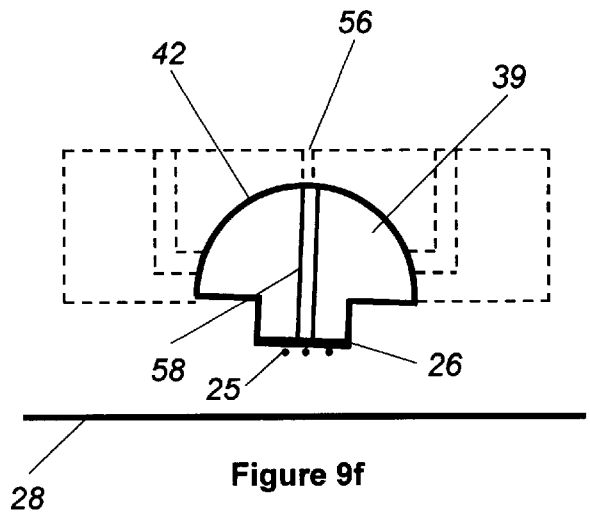
Figure 9G:
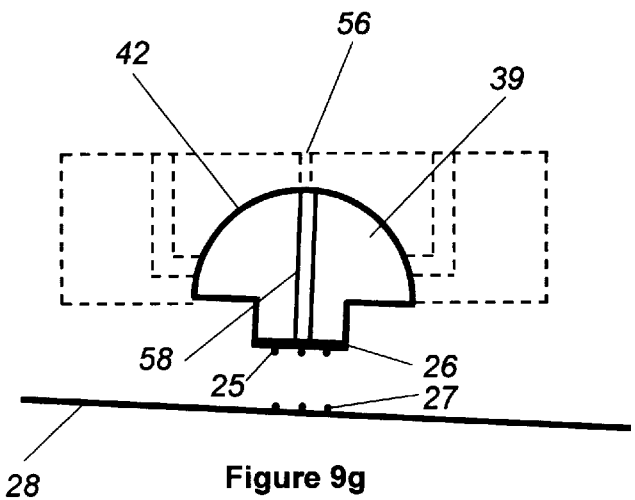
Figure 9H:
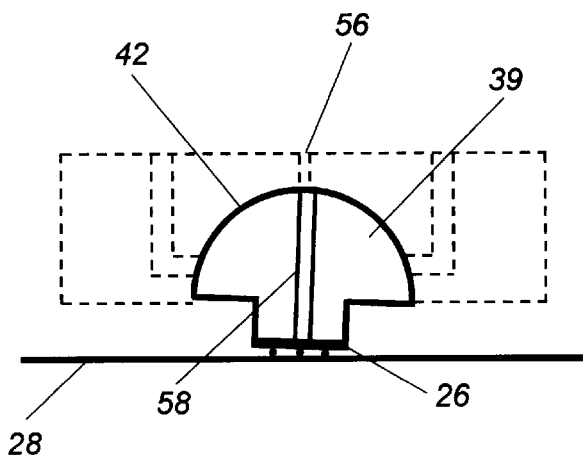

Following preservation of the parallellity between the chip 26 and the substrate 28, the ball 39 is locked within the cavity 42 by increasing the ball vacuum force, and the chip holder assembly 24 is raised from the substrate 28, as shown in FIG. 9f. As illustrated in FIG. 9g, preferably using an infrared or similar camera system, the chip contact pads 25 may be vertically aligned with the substrate contact pads 27. Referring to FIG. 9h, with the chip still locked in place within the assembly 24, the chip 26 is lowered to the board 28 so that all of the chip and substrate conductive pads respectively mate. The conductive pads may be mounted to each other using tacking or solder-reflowing processes, the chip vacuum is released and the chip holder assembly 24 is removed leaving the chip 26 attached to the substrate 28.

The present invention has several advantages over conventional bonding systems. These advantages include, an improvement in angular parallellity, an ability to achieve parallellity between chips and boards having non-reflective surfaces, an ability to achieve parallellity between chips and boards that do not have parallel or smooth front and back surfaces, and an ability to use the chip holder assembly in automated high-volume flip-chip bonders. In addition to those advantages enumerated above, the present invention lessens the risk of device component damage by heavy components during bonding processes. Specifically, the vacuum mechanism used in the present invention allows the inner and outer holders to be manufactured small and lightweight. A reduction in weight is important because as pressure is applied to achieve parallellity between the chip and the substrate, the weight of the pivoting holder is less likely to cause device component damage.

Obviously, many modifications and variations of the present invention are possible in light of the above teachings. Thus, it is to be understood that, within the scope of the appended claims, the invention may be practiced otherwise than as specifically described above.

What is claimed is:

1. A method for parallelly aligning a chip to a substrate, comprising:

applying a first vacuum to hold said chip to an inner holder;

applying a second vacuum to releaseably hold said inner holder within a cavity formed on an outer holder;

placing said chip in contact with said substrate;

releasing said second vacuum and allowing said inner holder to rotate within said cavity while said chip aligns parallel with said substrate; and reapplying said second vacuum to secure said inner holder orientation.

2. The method as recited in claim 1, further comprising bonding said chip to said substrate.

3. The method as recited in claim 1, wherein bonding said chip to said substrate comprises:

providing a pattern of conductive pads on a surface of said chip;

providing a pattern of conductive pads on a surface of said substrate, wherein said substrate conductive pad pattern correspondingly matches said chip conductive pattern;

placing said parallel aligned chip in contact with said substrate wherein each said chip conductive pads mates with each said corresponding substrate conductive pad;

reflowing each said chip conductive pad with each said corresponding substrate conductive pad; and releasing said first vacuum, wherein said chip detaches from said inner holder.

* * * * *